Figure 1:
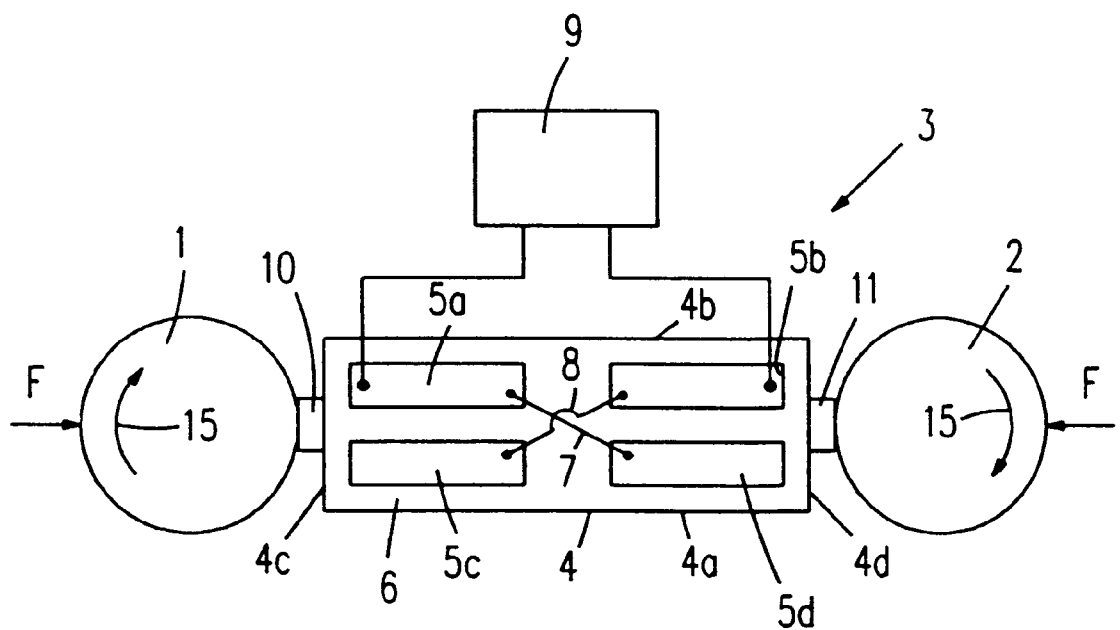

United States Patent

Diefenbach et al.

[11] Patent Number: 6,121,717
[45] Date of Patent: *Sep. 19, 2000

[54] DRIVING DEVICE FOR AT LEAST TWO ROTATION ELEMENTS, WHICH DEVICE COMPRISES AT LEAST ONE PIEZOELECTRIC DRIVING ELEMENT

[75] Inventors: Gerhard Diefenbach, Aachen; Christian Reichinger, Alsdorf; Matthias Wendt, Würselen, all of Germany

[73] Assignee: U.S. Philips Corporation, New York, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 09/201,045

[22] Filed: Nov. 30, 1998

[30] Foreign Application Priority Data

Dec. 20, 1997 [DE] Germany ............................ 197 57 139

[51] Int. Cl.[7] ..................................................... H01L 41/08
[52] U.S. Cl. ................................ 310/323.02; 310/323.12; 310/323.16
[58] Field of Search ............................... 310/328, 323.02, 310/323.16, 323.12

[56] References Cited

U.S. PATENT DOCUMENTS

| | | |
|---|---|---|
| 4,019,073 | 4/1977 | Vishnevsky et al. ............... 310/323.02 |
| 4,453,103 | 6/1984 | Vishnevsky et al. ............... 310/323.02 |
| 4,663,556 | 5/1987 | Kumada ..................................... 310/333 |
| 4,947,076 | 8/1990 | Kumada ............................. 310/323.02 |
| 5,554,905 | 9/1996 | Gschwind et al. .................. 310/323.02 |
| 5,640,063 | 6/1997 | Zumeris et al. ......................... 310/328 |
| 5,696,421 | 12/1997 | Zumeris et al. ......................... 310/328 |
| 5,714,833 | 2/1998 | Zumeris et al. ......................... 310/328 |

FOREIGN PATENT DOCUMENTS

| | | | |
|---|---|---|---|
| 0089583 | 5/1984 | Japan ................................. 310/323.16 |
| 0765910 | 9/1980 | U.S.S.R. ............................ 310/323.16 |
| 0817816 | 4/1981 | U.S.S.R. ............................ 310/323.16 |
| 1128292 | 12/1984 | U.S.S.R. ............................ 310/323.16 |

*Primary Examiner*—Mark O. Budd
*Attorney, Agent, or Firm*—F. Brice Faller

[57] ABSTRACT

The invention relates to a driving device for at least two rotation elements, which device comprises at least one piezoelectric driving element. The object of the invention is to provide such a driving device having a high efficiency and allowing a more flexible positioning of the rotation elements.

The invention is characterized in that the piezoelectric driving element comprises a piezoelectric resonator and at least two friction elements arranged on the piezoelectric resonator and disposed opposite one another, the piezoelectric resonator with the friction elements is arranged between the two rotation elements and is restrained by means of a pre-loading force, each one of the friction elements acts upon one of the rotation elements, and electrical means for the excitation of a vibration mode of the piezoelectric resonator have been provided.

18 Claims, 4 Drawing Sheets

DRIVING DEVICE FOR AT LEAST TWO ROTATION ELEMENTS, WHICH DEVICE COMPRISES AT LEAST ONE PIEZOELECTRIC DRIVING ELEMENT

The invention relates to a driving device for at least two rotation elements, which device comprises at least one piezoelectric driving element.

Such a driving device is known from, for example, DE 35 00 607 C2. This known driving device comprises a piezoelectric thickness resonator whose thickness vibrations are converted to torsional vibrations of a torsional resonator by means of a torsional coupler.

Such a configuration has a low efficiency because the active piezo volume is substantially smaller than the volume of the torsional resonator to be excited. The axial distance between the individual rotation elements in this known driving device is dictated by the dimensions of the torsional resonator. A reversal of the direction of rotation is possible only when the motor unit is displaced relative to the axes.

It is an object of the invention to provide another driving device of the type defined in the opening paragraph, which driving device has a higher efficiency and allows a more flexible positioning of the rotation elements.

According to the invention this object is achieved in that the piezoelectric driving element comprises a piezoelectric resonator and at least two friction elements which are arranged on the piezoelectric resonator and are disposed opposite one another, the piezoelectric resonator with the friction elements is arranged between the two rotation elements and is restrained by means of a pre-loading force, each one of the friction elements acts upon one of the rotation elements, and electrical means for the excitation of a vibration mode of the piezoelectric resonator have been provided With the aid of the electrical means the piezoelectric resonator and the friction elements secured to the piezoelectric resonator are together set into vibration. The vibrating friction elements periodically act upon one of the rotation elements, as a result of which a frictional force is produced between the rotation elements and the friction elements. This frictional force causes the rotation elements to rotate. The pre-loading force guarantees a reliable engagement of the friction elements with the rotation elements.

In this driving device the piezoelectric resonator acts directly upon the rotation elements by means of the friction elements. An additional resonator is not needed. Therefore, the required volume for the piezoelectric driving element is substantially smaller than in the configuration in accordance with DE 35 00 607 C2. The attainable efficiency is significantly higher and is of the order of magnitude of 10%. The piezoelectric resonator preferably has a rectangular geometry. As a result of this, it can readily be adapted to different axial distances between the rotation elements. A driving device of this kind provides much freedom in the design. The number of rotation elements can be increased or reduced almost arbitrarily by varying the number of piezoelectric driving elements that are used.

Rotation elements are to be understood to mean rotatable elements, for example drive shafts or drive wheels.

In an advantageous embodiment of the invention the piezoelectric resonator is a mono-mode resonator. The monomode resonator can be either an extensional-mode resonator or a flexural-mode resonator. If the monomode resonator takes the form of an extensional-mode resonator and is interposed between two rotation elements, the axis of vibration of the extensional-mode resonator is preferably given a slightly inclined orientation with respect to the connecting line between the two rotation elements in order to guarantee a stable rotation of the rotation elements. The two rotation elements then rotate in the same direction.

Alternatively, the monomode resonator can be a flexural-mode resonator. In order to ensure a stable rotation of the two rotation elements the flexural-mode resonator is arranged so as to be slightly displaced parallel to the connecting line between the two rotation elements. The two rotation elements are then driven in opposite directions by means of the opposite friction elements of the flexural-mode resonator.

In an advantageous embodiment of the invention as defined in claim 3 the piezoelectric resonator is a dual-mode resonator. Individual points of the dual-mode resonator can perform two-dimensional circular or elliptical rotary movements. The direction of the rotary movement can be changed by changing the excitation with the aid of the electrical excitation means. This enables the direction of rotation of the two rotation elements to be reversed in a simple manner by means of the dual-mode resonator. The dual-mode resonator is preferable arranged exactly symmetrically between the two rotation elements, the axis of the extensional mode of the dual-mode resonator substantially coinciding with the connecting line between the two rotation elements. The friction elements of the dual-mode resonator also perform elliptical or circular movements and then each exert a unidirectional frictional force on the rotation elements. As a result of this, the two rotation elements are rotated in the same direction of rotation.

In accordance with claim 6 the driving device is preferably designed in such a manner that the two friction elements perform an elliptical movement. An elliptical movement enables a particularly satisfactory frictional force to be obtained between the friction elements and the rotation elements. This is particularly so when the longitudinal axis of symmetry of the ellipse is inclined with respect to the connecting line between the two rotation elements. The principal direction of movement of the friction elements can be adjusted via the longitudinal axis of symmetry. In this way, it is possible to realize the advantageous embodiment of the invention as defined in claim 7. In this advantageous embodiment of the invention the principal direction of movement of the friction elements, i.e. the direction of movement having the direction of the longitudinal axis of symmetry of the ellipse, essentially corresponds to the angle of friction of the materials of the relevant rotation element and of the relevant friction element. Thus, it is possible to obtain a static friction between the friction elements and the rotation elements and, consequently, an optimum efficiency of the driving device. The highest force of static friction can be achieved by means of the advantageous embodiment defined in claim 8. A particularly suitable material having an angle of friction of 28.8° is aluminum oxide, as is claimed in claim 9.

The advantageous embodiment of the invention as defined in claim 4 can be realized very simply and at low cost. By means of the driving members which project from the piezoelectric plate the amplitude of the vibration of the friction elements is achieved. The direction of polarization is the same under all four electrodes of the first surface. Preferably, as is claimed in claim 5, the resonant frequencies of the two orthogonal vibrations of the dual-mode resonator are so close to one another that the two orthogonal vibrations can be produced with a satisfactory amplitude and with the desired phase relationship by means of an electrically impressed operating frequency. In this advantageous embodiment of the invention only two of the four electrodes plus the common ground electrode as claimed in claim 4 must be coupled to an electronic control circuit. As a result of this, the entire electronic control circuit requires less components.

The advantageous embodiment of the invention as defined in claim 10 and the advantageous embodiment of the invention as defined in claim 11 are particularly suitable for use in shavers. The driving device as claimed in claim 10 has the advantage that the three piezoelectric driving elements and their driving forces are disposed symmetrically with respect to the three rotation elements. Consequently, the torques of the three rotation elements are also the same.

The driving device as claimed in claim 11 has the advantage that three rotation elements can be driven by means of only two piezoelectric driving elements. Thus, one piezoelectric driving element is saved in comparison with the driving device as claimed in claim 10. The rotation element which is coupled to both piezoelectric driving elements has a higher torque than the two other rotation elements. However, this is not a drawback for use in a shaver because for this use the three rotation elements should merely have the same number of revolutions. In the driving device as claimed in claim 11 this is guaranteed. In this driving device, according to claim 12, one of the three rotation elements is preferably mounted in a fixed bearing and the other two rotation elements are mounted in a floating bearing. A fixed bearing is to be understood to means a bearing which is mounted on the housing of the driving device so as to be non-movable. Conversely, the floating bearings are arranged in the housing of the driving device so as to be movable, for example in a slot. This makes it possible to restrain the floating bearings with respect to the piezoelectric driving elements, for example by means of a spring arranged between the housing and the floating bearing and whose spring force is transferred to the relevant piezoelectric driving element via the floating bearing.

As is defined in claim 13, the bearing construction in a configuration comprising two rotation elements can be realized in a similar manner.

Figure 2:
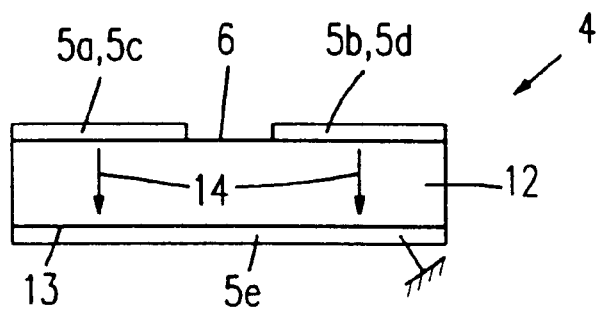
Figure 3:
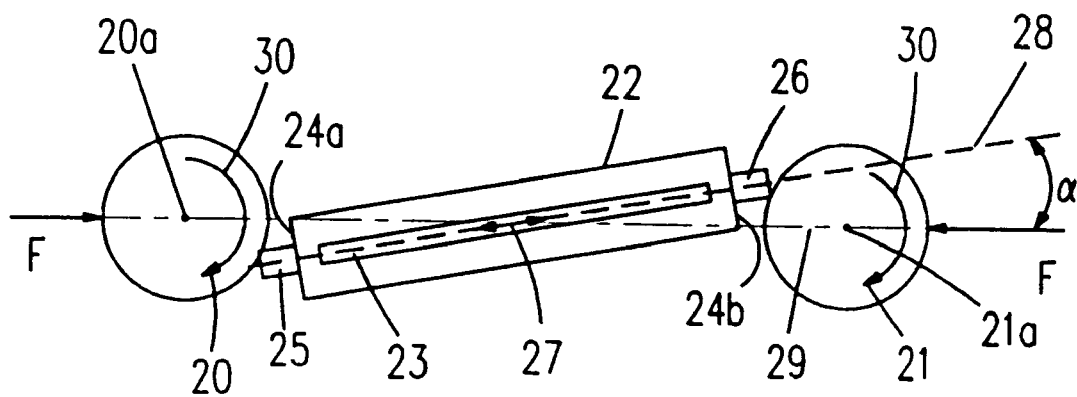
Figure 4:
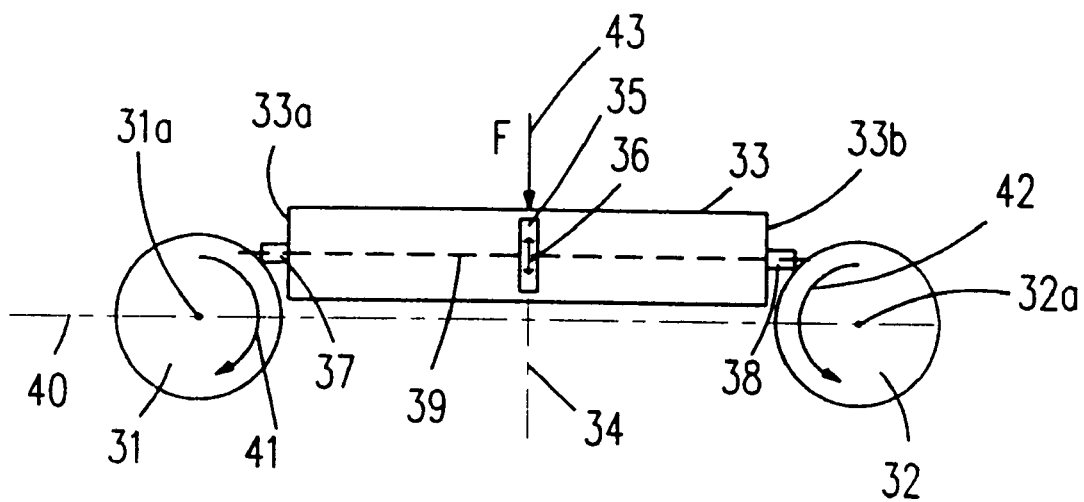
Figure 5:
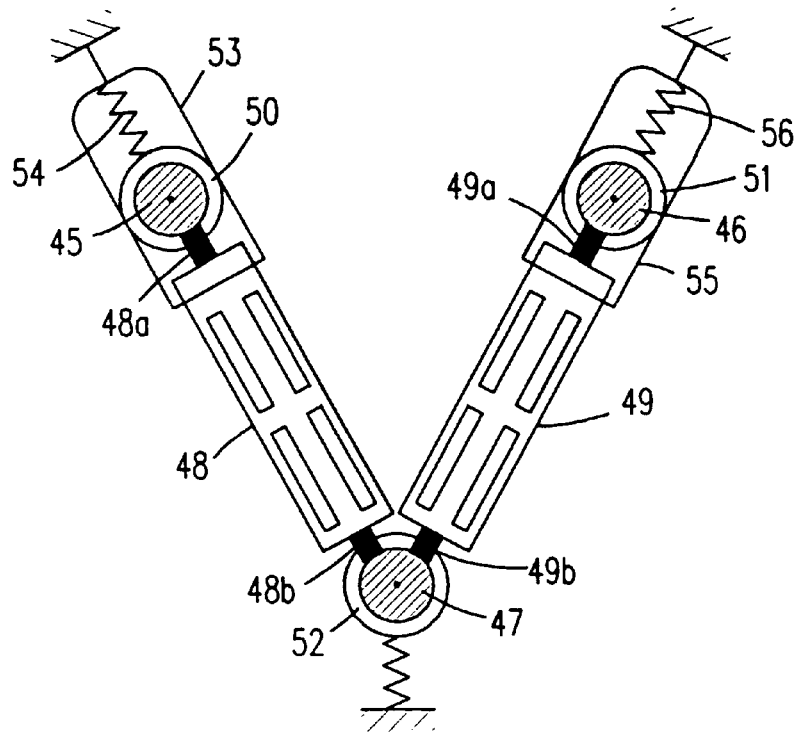
Figure 6:
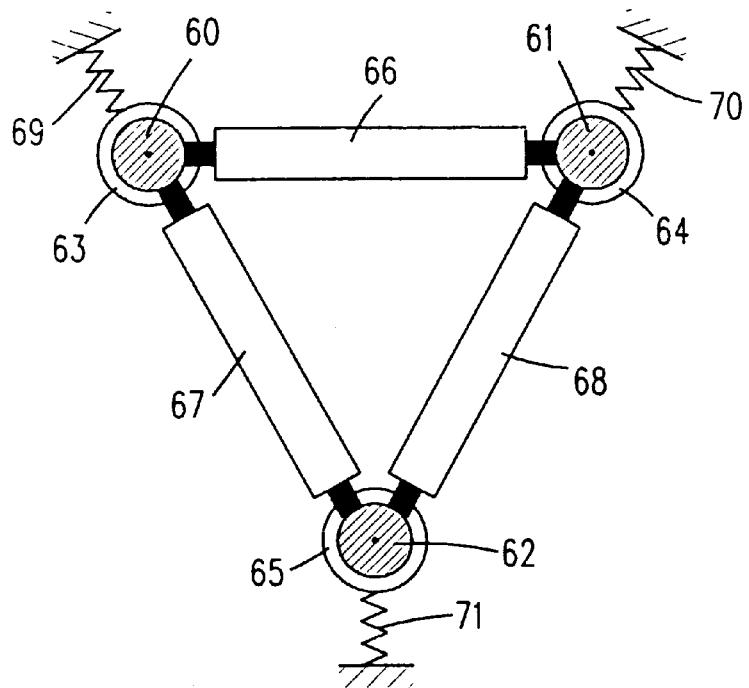
Figure 7:
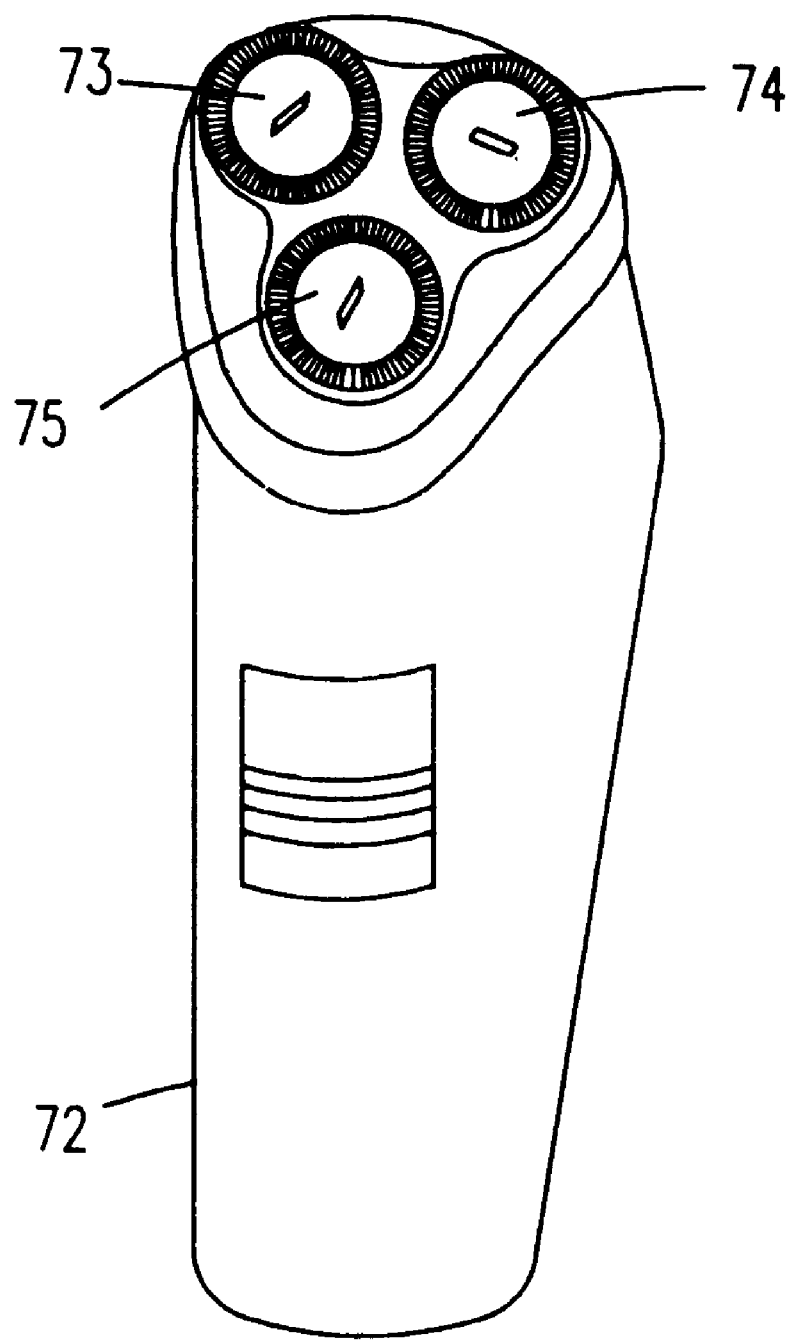

Some embodiments of the invention will be described in more detail, by way of examples, with reference to FIGS. 1 to 7 of the drawings. In the drawings:

FIG. 1 shows diagrammatically a driving device for two drive shafts, a dual-mode piezoelectric resonator being held between the two drive shafts under the influence of a pre-loading force, FIG. 2 is a side view of the piezoelectric resonator shown in FIG. 1, FIG. 3 shows diagrammatically a driving device for two drive shafts, an extensional-mode piezoelectric monomode resonator being arranged between the two drive shafts, FIG. 4 shows a driving device for two drive shafts, a flexural-mode piezoelectric monomode resonator being held between the two drive shafts under the influence of a pre-loading force, FIG. 5 shows a driving device for three drive shafts, two piezoelectric resonators each being held between two of the three drive shafts under the influence of a pre-loading force, FIG. 6 shows a driving device for three drive shafts, three piezoelectric resonators each being arranged between two of the three drive shafts under the influence of a pre-loading force, FIG. 7 shows a shaver comprising three cutters arranged in a triangular configuration and each driven by a drive shaft, a driving device as shown in FIG. 5 or as shown in FIG. 6 being provided for the three drive shafts.

FIG. 1 shows a driving device for two rotation elements. The first rotation element is a first drive shaft 1 and the second rotation element is a second drive shaft 2. The first drive shaft 1 and the second drive shaft 2 are spaced from one another. A piezoelectric driving element 3 is arranged between the first drive shaft 1 and the second drive shaft 2. The piezoelectric driving element 3 comprises a rectangular dual-mode piezoelectric resonator 4 having a first side face 4a, a second side face 4b, a third side face 4c and a fourth side face 4d. The piezoelectric resonator has a first electrode 5a, a second electrode 5b, a third electrode 5c and a fourth electrode 5d. The four electrodes 5a, 5b, 5c and 5d are arranged on a first main surface 6 of the piezoelectric resonator 4, for example by means of a screen-printing process. The first electrode 5a and the fourth electrode 5d are electrically connected to one another by means of a first bonding wire 7 and the second electrode 5b and the third electrode 5c are electrically connected to one another by means of a second bonding wire 8. The first electrode 5a and the second electrode 5b are coupled to an electrical control unit 9 which generates electric signals for exciting a vibration in the piezoelectric resonator 4. A first driving member 10 is centrally connected to the third side face 4c, for example by means of an adhesive bond. A second driving member 11 is centrally connected to the fourth side face 4d, for example by means of an adhesive bond. The first driving member 10 and the second driving member 11 are preferably made of aluminum oxide.

FIG. 2 shows a side view of the piezoelectric resonator 4. The piezoelectric resonator 4 comprises a piezoelectric body 12 having a first main surface 6 and a second main surface 13. The second main surface 13 is wholly covered with a ground electrode 5e. The ground electrode 5e is likewise coupled to the control unit 9 in a manner not shown. The direction of polarization of the piezoelectric body 12 is the same underneath the four electrodes 5a, 5b, 5c and 5d on the first main surface 6. The direction of polarization is indicated by means of two arrows 14 in FIG. 2.

As shown in FIG. 1, the piezoelectric resonator 4 with the first driving member 10 and the second driving member 11 connected to it is held between the first drive shaft 1 and the second drive shaft 2 under the influence of a pre-loading force F. As a result of this pre-loading force F, the first driving member 10 is urged against the first drive shaft 1 and the second driving member 11 is urged against the second drive shaft 2. The first drive shaft 1 and the second drive shaft 2 are coated with a layer of aluminum oxide. By means of the control unit 9, which applies electric signals to the first electrode 5a and the ground electrode 5e, the piezoelectric resonator 4 can be excited to produce a dual-mode vibration. The pre-loading force F, the geometry of the piezoelectric resonator 4 and the friction coefficients between the first driving member 10 and the first drive shaft 1 and between the second driving member 11 and the second drive shaft 2 are dimensioned in such a manner that the piezoelectric resonator 4, the first driving member 10 and the second driving member 11 perform an elliptical rotary movement. The first driving member 10 and the second driving member 11 then exert a frictional force on the first drive shaft 1 and the second drive shaft 2, respectively, as a result of which the first drive shaft 1 and the second drive shaft 2 are rotated. Since the direction of rotation of the elliptical rotary movement of the first driving member 10 and the second driving member 1 is the same the first drive shaft 1 and the second drive shaft 2 are driven in the same direction of rotation by the vibrating piezoelectric resonator 4. A first direction of rotation 15 is indicated in FIG. 1.

By applying the control signals from the first control unit 9 to the second electrode 5b and the ground electrode 5e the piezoelectric resonator 4 can also produce an elliptical vibration mode which is directed oppositely to the vibration mode represented in FIG. 1. Consequently, the configuration shown in FIG. 1 also enables the drive shafts to be rotated in a direction opposite to the first direction of rotation 15. Thus, a reversal of the direction of rotation of the first drive shaft 1 and the second drive shaft 2 can be achieved only by changing the control signals from the control unit 9.

The angle of friction of aluminum oxide is 28.8°. The pre-loading force F and the geometry of the piezoelectric resonator 4 are therefore dimensioned in such a manner that during the elliptical rotary movement the first driving member 10 and the second driving member 11 respectively contact the first drive shaft 1 and the second drive shaft 2 substantially at an angle of 28.8°. Thus, the angle of contact of the first driving member 10 and of the second driving member 11 substantially corresponds to the angle of friction. In the case of an optimum control voltage static friction occurs between the first driving member 10 and the first drive shaft 1 and between the second driving member 11 and the second drive shaft 2 and this results in an optimum speed. This guarantees a good efficiency of the driving device.

The speed and the torque of the first drive shaft 1 and the second drive shaft 2 can be changed or adjusted via the amplitude of the voltage supplied by the first control unit 9 and via the pre-loading force F.

The precise construction and the various possibilities of the electrical actuation of the piezoelectric resonator 4 are described in EP 633 616 A2, which is incorporated in the present Application by reference.

FIG. 3 shows a driving device comprising a first drive shaft 20 and a second drive shaft 21. A monomode piezoelectric resonator 22 is arranged between the first drive shaft 20 and the second drive shaft 21. The piezoelectric resonator 22 is rectangular and has a first electrode 23 on its upper surface and a ground electrode, not shown, on its rear surface. The first extensional-mode 23 has a shape which enables the excitation of extensional vibrations. The piezoelectric resonator 22 is constructed as an extensional-mode resonator. The piezoelectric resonator 22 has a first driving member 25 on its end face 24a and a second driving member 26 on its opposite end face 24b. The first driving member 25 and the second driving member 26 are secured to the piezoelectric resonator 22 by means of an adhesive bond. The piezoelectric resonator 22 is actuated by means of an electrical control unit, not shown, so as to produce extensional vibrations in the direction indicated by the double arrow 27. The longitudinal axis of symmetry 28 of the piezoelectric resonator 22 is inclined at an acute angle $\alpha$ with respect to the connecting line 29 which connects the axis of rotation 20a of the first drive shaft 20 and the axis of rotation 21a of the second drive shaft 21. The piezoelectric resonator 22 with the first driving member 25 and the second driving member 26 is held between the first drive shaft 20 and the second drive shaft 21 by means of a pre-loading force F. In the vibration mode the first driving member 25 and the second driving member 26 apply micro-impulses to the first drive shaft 20 and the second drive shaft 21 in the direction indicated by the double arrow 27, as a result of which these two shafts are driven in the same direction of rotation 30.

FIG. 4 shows a driving device comprising a first drive shaft 31 and a second drive shaft 32. The first shaft 31 has a center 31a and the second shaft 32 has a center 32a. A rectangular piezoelectric resonator 33 is arranged between the first drive shaft 31 and the second drive shaft 32. The piezoelectric resonator 33 has a first electrode 35 on its upper surface and a ground electrode, not shown, on its lower surface. The first electrode 35 has a shape which enables the excitation of flexural vibrations. The piezoelectric resonator 33 can be actuated by means of an electrical control unit, not shown, so as to produce flexural vibrations in the direction indicated by the double arrow 36. The piezoelectric resonator 33 has a first driving member 37 on its end face 33a and a second driving member 38 on its end face 33b. The longitudinal axis of symmetry 39 of the piezoelectric resonator 33 is displaced perpendicular to the connecting line 40 between the axis of rotation 31a of the first drive shaft 31 and the axis of rotation 32a of the second drive shaft 32.

In its vibration mode the piezoelectric resonator 33 together with the first driving member 37 and the second driving member 38 vibrates in the direction indicated by the double arrow 36, as a result of which the first driving member 37 applies micro-impulses to the first drive shaft 31 and the second driving member 38 applies micro-impulses to the second drive shaft 32. This causes the first drive shaft 31 to be rotated in the first direction of rotation 41 and the second drive shaft 32 to be rotated in the opposite direction of rotation 42.

A pre-loading force F urges the piezoelectric resonator 33 against the first drive shaft 31 and the second drive shaft 32 in the direction indicated by the arrow 43.

FIG. 5 shows a driving device comprising a first drive shaft 45, a second drive shaft 46 and a third drive shaft 47, which are arranged in a triangular configuration. A first piezoelectric resonator 48 is arranged between the first drive shaft 45 and the third drive shaft 47 and a second piezoelectric resonator 49 is arranged between the second drive shaft 46 and the third drive shaft 47. The first piezoelectric resonator 48 and the second piezoelectric resonator 49 are dual-mode piezoelectric resonators of a construction as described with reference to FIG. 1. The first drive shaft 45 is mounted in a first floating bearing 50, the second drive shaft 46 is mounted in a second floating bearing 51, and the third drive shaft 47 is mounted in a fixed bearing 52. The first floating bearing 50 is movable in a slot 53 and is urged towards the first piezoelectric resonator 48 by means of a spring. The slot 53 has been formed in a housing, not shown, of the driving device. The second floating bearing 51 is movable in a slot 55 and is urged towards the second piezoelectric resonator 49 by means of a spring 56. The fixed bearing 52 is fixedly secured to the housing, not shown. The first piezoelectric resonator 48 comprises a first driving member 48a, which engages against the first drive shaft 45, and a second driving member 48b, which engages against the third drive shaft 47. The second piezoelectric resonator 49 comprises a first driving member 49a, which engages against the second drive shaft 46, and a second driving member 49b, which engages against the third drive shaft 47.

The first drive shaft 45 is thus resiliently urged against the first piezoelectric resonator 48 by the spring force of the spring 54, as a result of which the first piezoelectric resonator 48 is resiliently held between the first drive shaft 45 and the third drive shaft 47. Likewise, the second piezoelectric resonator 49 is resiliently held between the second drive shaft 46 and the third drive shaft 47 by means of the spring 56.

The first piezoelectric resonator 48 and the second piezoelectric resonator 49 can be excited by means of a control unit, not shown, to produce elliptical vibrations, as a result of which the driving members 48a, 48b, 49a and 49b exert a frictional force on the first drive shaft 45, the second drive shaft 46 and the third drive shaft 47. The directions of rotation of the three drive shafts 45, 46 and 47 are the same and can be reversed by means of the control unit, not shown in FIG. 5, as described with reference to FIG. 1.

The speeds of rotation of the three drive shafts 45, 46 and 47 are substantially equal. Since the third drive shaft 47 cooperates both with the first piezoelectric resonator 48 and with the second piezoelectric resonator 49 the available torque of the third drive shaft 47 is greater than the available torque of the third drive shaft 45 and the second drive shaft 46.

FIG. 6 shows a driving device comprising a first drive shaft 60, a second drive shaft 61 and a third drive shaft 62, which are arranged in a triangular configuration. The first drive shaft 60 is mounted in a floating bearing 63, the second drive shaft 61 is mounted in a floating bearing 64, and the third drive shaft 62 is mounted in a floating bearing 65. A first piezoelectric resonator 66 is arranged between the first drive shaft 60 and the second drive shaft 61. A second piezoelectric resonator 67 is arranged between the first drive shaft 60 and the third drive shaft 62. A third piezoelectric resonator 68 is arranged between the second drive shaft 61 and the third drive shaft 62. The first piezoelectric resonator 66, the second piezoelectric resonator 67 and the third piezoelectric resonator 68 are each of a construction as described with reference to FIG. 1. The floating bearing 63 is urged against a housing, not shown, by means of a spring 69. The floating bearing 64 is urged against a housing, not shown, by means of a spring 70, and the floating bearing 65 is urged against a housing, not shown, by means of a spring 71. Thus, the first piezoelectric resonator 66 is resiliently held between the first drive shaft 60 and the second drive shaft 61, the second piezoelectric resonator 67 is resiliently held between the first drive shaft 60 and the third drive shaft 62, and the third piezoelectric resonator 68 is resiliently held between the second drive shaft 61 and the third drive shaft 62. The three piezoelectric resonators 66, 67 and 68 can be excited by means of a control unit, not shown, to produce elliptical vibrations, as a result of which the first drive shaft 60, the second drive shaft 61 and the third drive shaft 62 are driven in the same direction of rotation. A direction reversal can be effected simply by means of the electrical control unit. Owing to the wholly symmetrical configuration of the driving device shown in FIG. 6 both the available torque and the number of revolutions is the same for the three drive shafts 60, 61 and 62.

FIG. 7 shows a shaver 72 having a first shaving head 73, a second shaving head 74 and a third shaving head 75. The first shaving head 73, the second shaving head 74 and the third shaving head 75 are driven by means of a driving device as shown in FIG. 5 or a driving device as shown in FIG. 6.

What is claimed is:

1. A driving device for at least two rotation elements, which device comprises at least one piezoelectric driving element, characterized in that the piezoelectric driving element comprises a dual mode piezoelectric resonator and at least two friction elements which are arranged on the piezoelectric resonator and are disposed opposite one another, the piezoelectric resonator with the friction elements is arranged between the two rotation elements and is restrained by means of a pre-loading force, each one of the friction elements acts upon one of the rotation elements, and electrical means for the excitation of a vibration mode of the piezoelectric resonator have been provided wherein the pre-loading force, the geometry of the piezoelectric resonator and the friction coefficients between the friction elements and the rotation elements are dimensioned so that the two friction elements perform a substantially elliptical rotary movement, and the longitudinal axis of symmetry of the ellipse is inclined with respect to the connecting line between the two rotation elements.

2. A driving device as claimed in claim 1, characterized in that the piezoelectric driving element comprises a substantially piezoelectric plate having a first main surface and a second main surface, the first main surface carries at least four electrodes and the second main surface carries at least one electrode, one electrode is arranged in each quadrant of the first main surface, and the friction elements are constructed as driving members which project from the piezoelectric plate.

3. A driving device as claimed in claim 1, characterized in that the geometry of the piezoelectric resonator is selected in such a manner that the two resonant frequencies of the piezoelectric resonator are so close to one another that upon excitation of one resonant frequency the other resonant frequency is excited likewise.

4. A driving device as claimed in claim 1, characterized in that the materials of the rotation elements and the friction elements are selected in such a manner that the friction angle lies in a range between 15° and 35°.

5. A driving device as claimed in claim 1, characterized in that the friction elements and/or the surfaces of the rotation elements consist of aluminum oxide.

6. A driving device as claimed in claim 1, characterized in that three rotation elements have been provided, which are arranged in a triangular configuration, and three piezoelectric driving elements have been provided, which driving elements are each arranged between two of the three rotation elements and are restrained by means of a pre-loading force.

7. A driving device as claimed in claim 1, characterized in that three rotation elements have been provided, which are arranged in a triangular configuration, and two piezoelectric driving elements have been provided, which driving elements are each arranged between two of the three rotation elements and are restrained by means of a pre-loading force.

8. A driving device as claimed in claim 7, characterized in that one of the three rotation elements is mounted in a fixed bearing and the other two rotation elements are each mounted in a floating bearing, the two piezoelectric driving elements are each arranged between the rotation element mounted in the fixed bearing and one of the rotation elements mounted in the floating bearings, and the floating bearings are pre-loaded with respect to the respective piezoelectric driving elements by means of a pre-loading force.

9. A driving device as claimed in claim 1, characterized in that one rotation element is mounted in a fixed bearing and the other rotation element is mounted in a floating bearing, the floating bearing being pre-loaded with respect to the piezoelectric driving element by means of a pre-loading force.

10. A driving device as claimed in claim 2, characterized in that the length-width ratio of the piezoelectric plate lies in a range between 1:3 and 1:4.

11. A shaver including a driving device as claimed in claim 1.

12. An electrical domestic appliance including a driving device as claimed in claim 1.

13. A driving device for driving two rotation elements, said device comprising two rotation elements having spaced apart axes of rotation connected by a connecting line, a mono-mode piezoelectric resonator, said mono-mode resonator being an extensional mode resonator having a longitudinal axis which crosses said connecting line at an acute angle, and a pair of friction elements which are arranged on the piezoelectric resonator and are disposed opposite one another on the longitudinal axis on opposite sides of the connecting line, each of the friction elements bearing on a respective one of the rotation elements with a pre-loading force, electrical means for causing the piezoelectric resonator to vibrate along said longitudinal axis, whereby said rotation elements are driven in the same direction of rotation.

14. A driving device for driving two rotation elements, said device comprising two rotation elements having spaced apart axes of rotation connected by a connecting line, a mono-mode piezoelectric resonator, said mono-mode resonator being a flexural mode resonator having a longitudinal axis which is parallel to the connecting line and an axis of vibration which is perpendicular to the connecting line, a pair of friction elements arranged on the piezoelectric resonator and disposed opposite one another, each of the friction elements bearing on a respective one of the rotation elements with a pre-loading force, and electrical means for causing the piezoelectric resonator to vibrate along said axis of vibration, whereby said rotation elements are driven in opposite directions of rotation, and each rotation element is driven in only one direction of rotation.

15. A driving device as in claim 13 wherein said axes of rotation are parallel.

16. A driving device as in claim 13 wherein said longitudinal axis is an axis of symmetry.

17. A driving device as in claim 13 wherein said longitudinal axis crosses said connecting line midway between said axes of rotation.

18. A driving device as in claim 13 wherein said rotation elements are driven in only one direction of rotation.

* * * * *